United States Patent
La

(10) Patent No.: US 7,068,550 B2
(45) Date of Patent: Jun. 27, 2006

(54) 4-BIT PREFETCH-TYPE FCRAM HAVING IMPROVED DATA WRITE CONTROL CIRCUIT IN MEMORY CELL ARRAY AND METHOD OF MASKING DATA USING THE 4-BIT PREFETCH-TYPE FCRAM

(75) Inventor: One-gyun La, Kyungki-do (KR)

(73) Assignee: Samsung Electronics, Co., Ltd. (KR)

( * ) Notice: Subject to any disclaimer, the term of this patent is extended or adjusted under 35 U.S.C. 154(b) by 374 days.

(21) Appl. No.: 10/719,306

(22) Filed: Nov. 21, 2003

(65) Prior Publication Data

US 2004/0114423 A1   Jun. 17, 2004

(30) Foreign Application Priority Data

Nov. 30, 2002   (KR) ............... 10-2002-0075692

(51) Int. Cl.
*G11C 7/00* (2006.01)
(52) U.S. Cl. ............. 365/195; 365/189.05; 365/230.06
(58) Field of Classification Search ................. 365/195
See application file for complete search history.

(56) References Cited

U.S. PATENT DOCUMENTS

| | | | | |
|---|---|---|---|---|
| 4,933,900 A | * | 6/1990 | Yamaguchi et al. | ... 365/189.03 |
| 5,521,878 A | * | 5/1996 | Ohtani et al. | ............... 365/233 |
| 5,612,922 A | * | 3/1997 | McLaury | ............... 365/230.05 |
| 5,802,005 A | | 9/1998 | Nakamura et al. | ..... 365/230.03 |
| 6,522,600 B1 | | 2/2003 | Ohshima et al. | ........... 365/233 |

FOREIGN PATENT DOCUMENTS

| | | |
|---|---|---|
| EP | 0831493 A2 | 3/1998 |
| JP | 10-125063 | 5/1998 |
| KR | 98-024859 | 7/1998 |
| KR | 02-0040111 | 5/2002 |

* cited by examiner

*Primary Examiner*—Tan T. Nguyen
(74) *Attorney, Agent, or Firm*—Mills & Onello LLP

(57) ABSTRACT

In a prefetch-type FCRAM having an improved data write control circuit and a method of masking data using the prefetch-type FCRAM, the prefetch-type FCRAM includes a command decoder, a row decoder, a column decoder, a data input buffer, a data output buffer, and a valid write window buffer. The command decoder outputs control commands including first and second write commands in response to predetermined external input signals. The row decoder decodes a row address signal input into the address pins and activates a wordline of the memory cell array corresponding to the decoded row address signal. The column decoder decodes a column address signal input into the address pins and activates a column select line of the memory cell array corresponding to the decoded column address signal. The data input buffer receives input data from the plurality of data pins and then outputs the input data in synchronization with a predetermined clock signal. The data output buffer outputs output data read from the memory cell array to the plurality of data pins. The valid write window buffer outputs a data masking control signal that controls the masking of input data in response to a combined address signal input into the address pins.

15 Claims, 12 Drawing Sheets

4-BIT PREFETCH-TYPE FCRAM HAVING IMPROVED DATA WRITE CONTROL CIRCUIT IN MEMORY CELL ARRAY AND METHOD OF MASKING DATA USING THE 4-BIT PREFETCH-TYPE FCRAM

BACKGROUND OF THE INVENTION

This application claims the priority of Korean Patent Application No. 2002-75692, filed Nov. 30, 2002, in the Korean Intellectual Property Office, the disclosure of which is incorporated herein in its entirety by reference.

1. Field of the Invention

The present invention relates to a semiconductor memory device, and more particularly, to a 4-bit prefetch-type fast cycle random access memory (FCRAM) having an improved circuit for controlling the writing of data and a method of masking data.

2. Description of the Related Art

In general, a semiconductor memory device includes a memory cell array having a matrix structure. When a row address and a column address are input into such a semiconductor memory device, data are read from or written to a memory cell indicated by the row and column addresses in response to a read control command or a write command.

As the operating speed of systems continues to increase, the operating speed of semiconductor memory devices becomes more likely to limit the performance of systems. In order to address such a limitation, high-performance DRAMs having enhanced operating speed, such as a synchronous DRAM (SDRAM), a double data rate (DDR) SDRAM, and a fast cycle RAM (FCRAM), have been developed. An example of a conventional FCRAM has been disclosed in U.S. Pat. No. 6,522,600.

In an SDRAM, data can be input and output at one of a rising edge or a falling edge of a clock signal. On the other hand, in a DDR SDRAM, data can be input and output at both a rising edge and a falling edge of a clock signal. Accordingly, the data transmission speed of a DDR SDRAM is two times as fast as the data transmission speed of an SDRAM. In addition, since a DDR SDRAM includes data input/output masking (DQM) pins, the inputting and outputting of data can be disabled according to predetermined latency when a data masking signal is activated.

An example of such a DDR SDRAM is shown in FIG. 1.

FIG. 1 is a block diagram of a DDR SDRAM having a typical data write control function. Specifically, in FIG. 1, an X16 DDR SDRAM, which includes 16 data input/output pins and is thus capable of processing 16 bits of data at the same time, is shown.

Referring to FIG. 1, a DDR SDRAM 100 includes a command decoder 101, an address buffer 102, a control signal generator 103, a memory cell array 104, a row decoder 105, a column decoder 106, a sense amplifier 107, and an input/output control circuit 108.

In addition, the DDR SDRAM 100 further includes data input buffers 109 and 110, data output buffers 111 and 112, a data masking (DM) buffer controller 113, first and second DM buffers 114 and 115, and first and second write controllers 116 and 117.

The command decoder 101 outputs a plurality of control commands including a write command WRITE in response to control signals /CS, /RAS, /CAS, and /WE input from an external source, for example, through control pins 121.

The address buffer 102 transmits a row address and a column address, which are input from an external source through address pins 122, to the row decoder 105 and the column decoder 106, respectively.

The control signal generator 103 activates a control signal CTL in response to the write command WRITE. Core circuits of a DRAM, for example, the row decoder 105, the column decoder 106, the input/output control circuit 108, the data input buffers 109 and 110, and the data output buffers 111 and 112 are controlled by the control signal CTL.

The row decoder 105 decodes the row address and activates a wordline in the memory cell array 104 corresponding to the row address. The column decoder 106 decodes the column address and enables a column select line in the memory cell array 104 corresponding to the column address.

The sense amplifier 107 senses, amplifies, and outputs data read from a selected memory cell.

The input/output control circuit 108 transmits the data amplified by the sense amplifier 107 to the data output buffers 111 and 112 and transmits data input into the data input buffers 109 and 110 to the memory cell array 104.

Data to be written are input into the data input buffers 109 and 110 via data input/output pins 123 and 124, and the data output buffers 111 and 112 output the read data via the data input/output pins 123 and 124.

The DM buffer controller 113 outputs a DM buffer control signal CTL_DMB in response to the write command WRITE. The first and second DM buffers 114 and 115 are turned on in response to the DM buffer control signal CTL_DMB and enable write control signals LDMC and UDMC, respectively, in response to write prevention signals LDM and UDM, respectively, input from an external source via data masking pins 125 and 126.

Here, the write prevention signal LDM is a signal for controlling the inputting of data DQ0 through DQ7 into the data input buffer 109. In addition, the write prevention signal UDM is a signal for controlling the inputting of data DQ8 through DQ15 into the data input buffer 110.

The first and second write controllers 116 and 117 enable buffer control signals WDML and WDMU, respectively, in response to the write control signals LDMC and UDMC, respectively. When the buffer control signal WDML is disabled, the data input buffer 109 is in a high impedance state, during which the data DQ0 through DQ7 are not input into the data input buffer 109. Likewise, when the buffer control signal WDMU is disabled, the data input buffer 110 is in a high impedance state, during which the data DQ8 through DQ15 are not input into the data input buffer 110. Accordingly, it is possible to mask data desired not to be written using the data masking pins 125 and 126.

FIG. 2 is a timing diagram of input and output signals of the DDR SDRAM shown in FIG. 1. As shown in FIG. 2, when the command decoder 101 outputs the write command WRITE in synchronization with a clock signal CLK, the control signal generator 103 enables the control signal CTL in response to the write command WRITE.

In addition, the DM buffer controller 113 enables the DM buffer control signal CTL_DMB in response to the write command WRITE.

The first and second DM buffers 114 and 115 are turned on in response to the DM buffer control signal CTL_DMB and enable the write control signals LDMC and UDMC, respectively, in response to the write prevention signals LDM and UDM, respectively.

In FIG. 2, the write prevention signal LDM is enabled and input when a first write command WRITE is output, and the write prevention signal UDM is enabled and input when a second write command WRITE is output.

As shown in FIG. 2, when the first write command WRITE is output and then the write prevention signal LDM is enabled and input, the write control signal LDMC is enabled. At this moment, the write prevention signal UDM is disabled, and thus the write control signal UDMC is disabled too.

When the write control signal LDMC is enabled, the first write controller 116 enables the buffer control signal WDML in response to the write control signal LDMC.

Since the control signal CTL and the buffer control signal WDML are enabled, the data DQ0 through DQ7 are input into the data input buffer 109.

As shown in FIG. 2, however, the buffer control signal WDMU is disabled, and thus the data DQ8 through DQ15 are not input into the data input buffer 110.

When the second write command WRITE is input, the write prevention signal UDM is enabled and input, and thus the data DQ8 through DQ15 are input into the data input buffer 110. Accordingly, the DDR SDRAM 100 has the function of masking data desired not to be written.

In the meantime, an FCRAM, unlike a DDR SDRAM, does not include data input/output masking pins for masking unwanted data. Accordingly, an FCRAM is also required to have a data masking function.

SUMMARY OF THE INVENTION

The present invention provides a 4-bit prefetch-type FCRAM having an improved data write control circuit capable of masking unwanted data by controlling a column decoder using a predetermined combined address signal without the need of a complicated circuit structure and a method of masking data using the same.

According to an aspect of the present invention, there is provided a prefetch-type FCRAM, for example a 4-bit FCRAM, having an improved data write control circuit in a semiconductor memory device including a memory cell array, a plurality of address pins, and a plurality of data pins. The 4-bit prefetch-type FCRAM includes a command decoder which outputs control commands including first and second write commands in response to predetermined external input signals; a row decoder which decodes a row address signal input into the address pins and activates a wordline of the memory cell array corresponding to the decoded row address signal; a column decoder which decodes a column address signal input into the address pins and activates a column select line of the memory cell array corresponding to the decoded column address signal; a data input buffer which receives input data from the plurality of data pins and then outputs the input data in synchronization with a predetermined clock signal; a data output buffer which outputs output data read from the memory cell array to the plurality of data pins; and a valid write window buffer which outputs a data masking control signal that controls the masking of input data in response to a combined address signal input into the address pins. Here, the column decoder disables a column select line where data to be masked among the input data will be input in response to the data masking control signal.

Preferably, the combined address signal is some of a plurality of bits applied to the address pins when the second write command is applied.

Preferably, the combined address signal includes a first address signal used for controlling the preventing the input data from being written; and a second address signal used for controlling a sequence of writing the input data.

Preferably, the valid write window buffer includes an input buffer and decoder which decodes the first address signal and outputs a predetermined write control signal; a valid write window control circuit which outputs a write information signal indicating whether to mask each bit of the input data, every four bits of which are input in series through the plurality of data pins, in response to the write control signal; and a sequence control circuit which determines a sequence of writing the input data in response to the second address signal and outputs the data masking control signal in response to the sequence and the write information signal.

Preferably, the valid write window control circuit includes a write information generation circuit which outputs an internal write information signal in response to the write control signal; and an output circuit which latches the internal write information signal and outputs the write information signal.

Preferably, the write information generation circuit comprises first through fourth write information generators which generate an internal write information signal in response to the write control signal, and the output circuit comprises first through fourth latches connected to the first through fourth write information generators, respectively, which latch the internal write information signal and output the write information signal.

Preferably, the first through fourth latches each include an initial value setting circuit for maintaining initial voltage levels of input ports of the first through fourth latches, respectively, at a predetermined level in response to a predetermined internal control signal when power is applied.

Preferably, each of the first through fourth write information generators includes a NAND gate, which performs a logic operation on the write control signal; a plurality of inverters which invert an output signal of the NAND gate and outputs the inverted signal; and a plurality of transmission gates which are turned on in response to the output signals of the NAND gate and the plurality of inverters and then output the internal write information signal.

Preferably, the plurality of transmission gates of at least one of the first through fourth write information generators have input ports connected to ground.

Preferably, the plurality of transmission gates of some of the first through fourth write information generators have some input ports connected to ground and other input ports connected to a predetermined internal voltage.

Preferably, the plurality of transmission gates of at least one of the first through fourth write information generators have input ports connected to a predetermined internal voltage.

Preferably, the first through fourth latches each include an inverter for inverting and outputting its corresponding latch's output signal.

According to another aspect of the present invention, there is provided a method of masking input data in a semiconductor memory device including a memory cell array, a plurality of address pins, and a plurality of data pins. The method includes (a) generating control commands including first and second write commands in response to predetermined external input signals; (b) receiving a row address signal, a column address signal, and an combined address signal through the plurality of address pins; (c) receiving the input data through the plurality of data pins; (d) decoding the row address signal and activating a wordline of the memory cell array corresponding to the decoded row address signal; (e) decoding the column address signal and enabling a column select line of the memory cell array corresponding to the decoded column address signal; (f) generating a data masking control signal that controls the masking of input data in response to the combined address signal; and (g) disabling, using a column decoder, a column select line where data to be masked among the input data will be input in response to the data masking control signal.

Preferably, the combined address signal is some of a plurality of bits applied to the address pins when the second write command is applied.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF PREFERRED EMBODIMENTS

Figure 1:
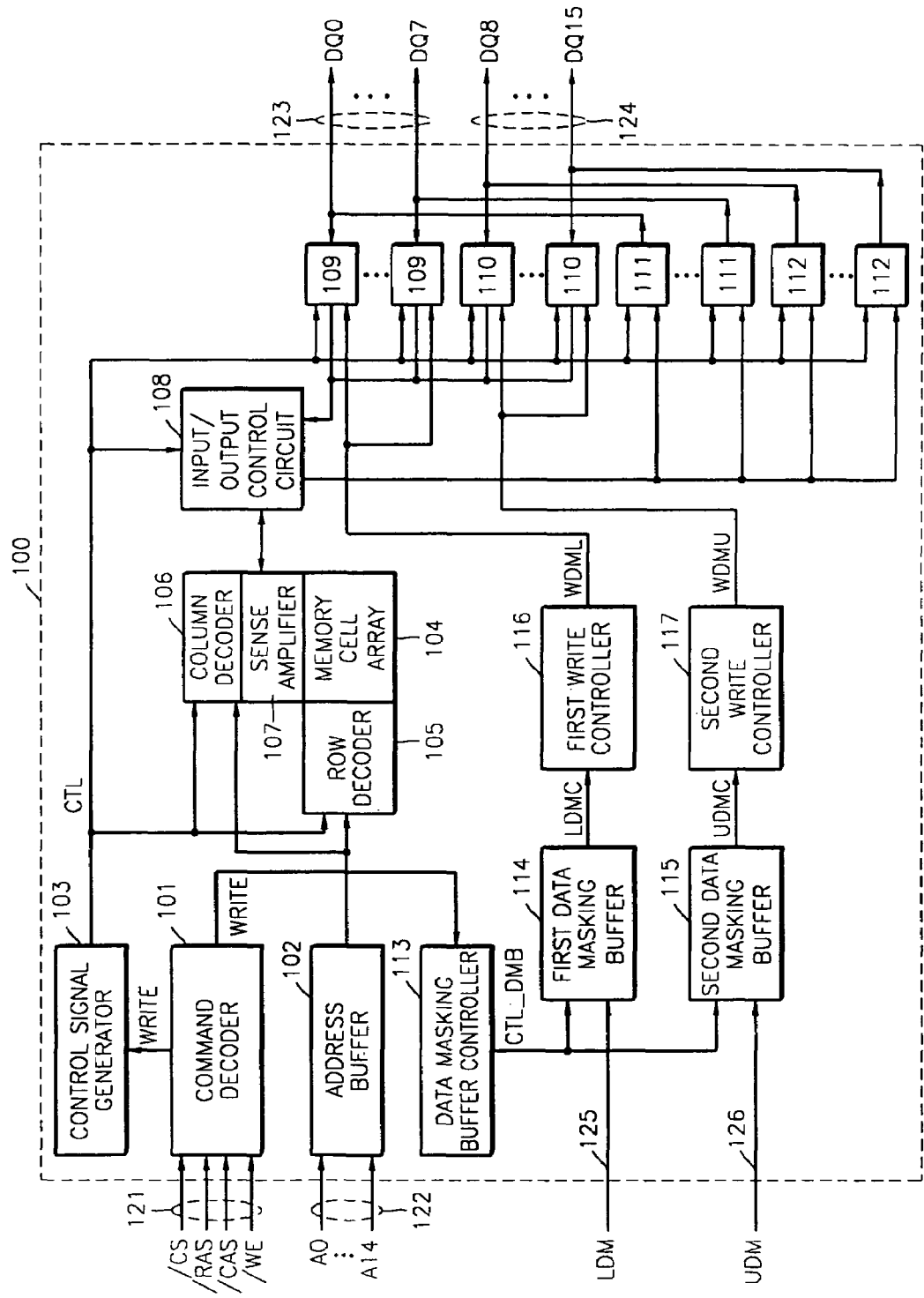
FIG. 1 is a block diagram of a DDR SDRAM having a conventional data write control function.
Figure 2:
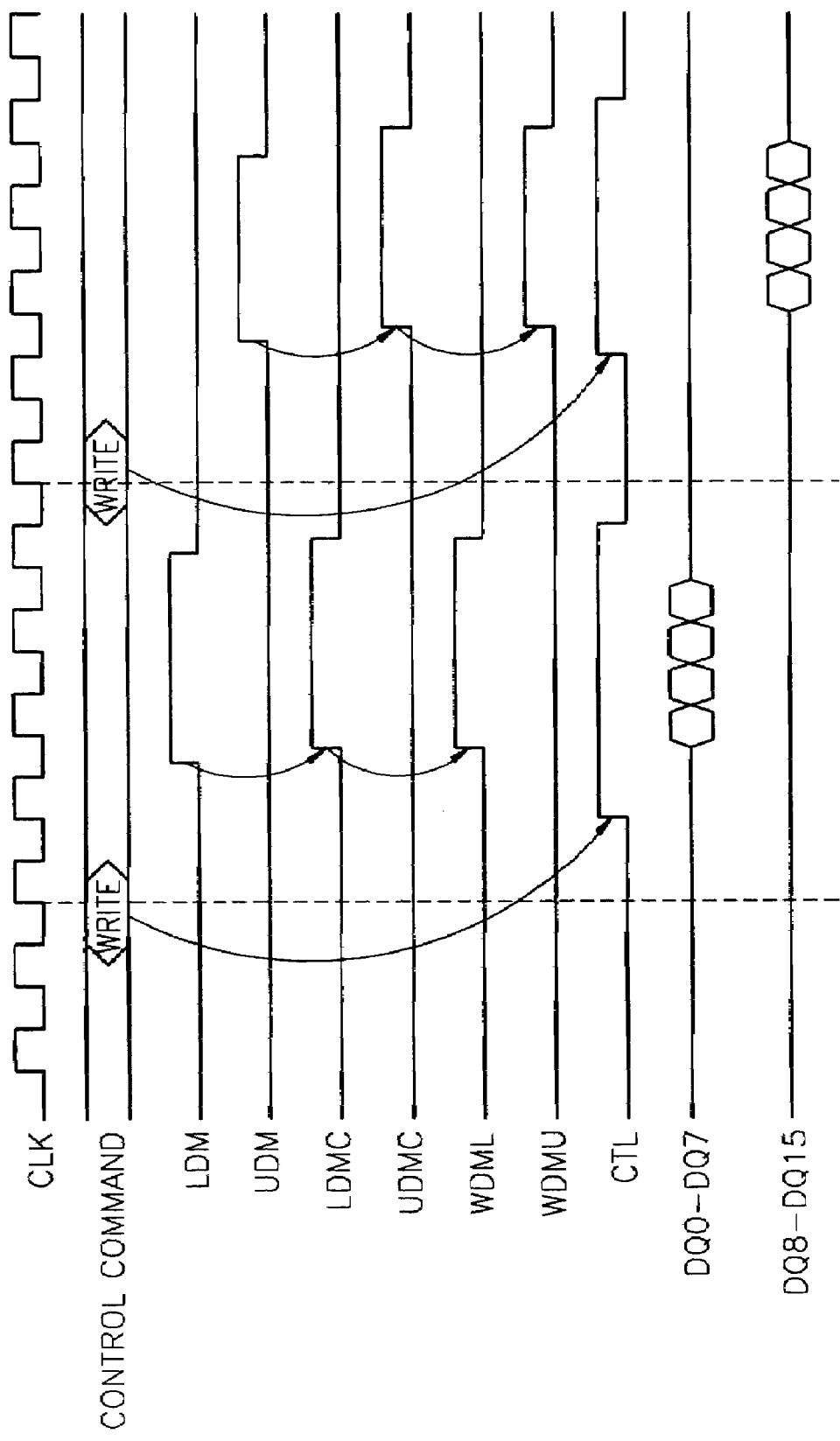
FIG. 2 is a timing diagram of input and output signals of the DDR SDRAM shown in FIG. 1.

The present invention will be described more fully with reference to the accompanying drawings, in which preferred embodiments of the invention are shown. The same reference numerals in different drawings represent the same elements.

Figure 3:
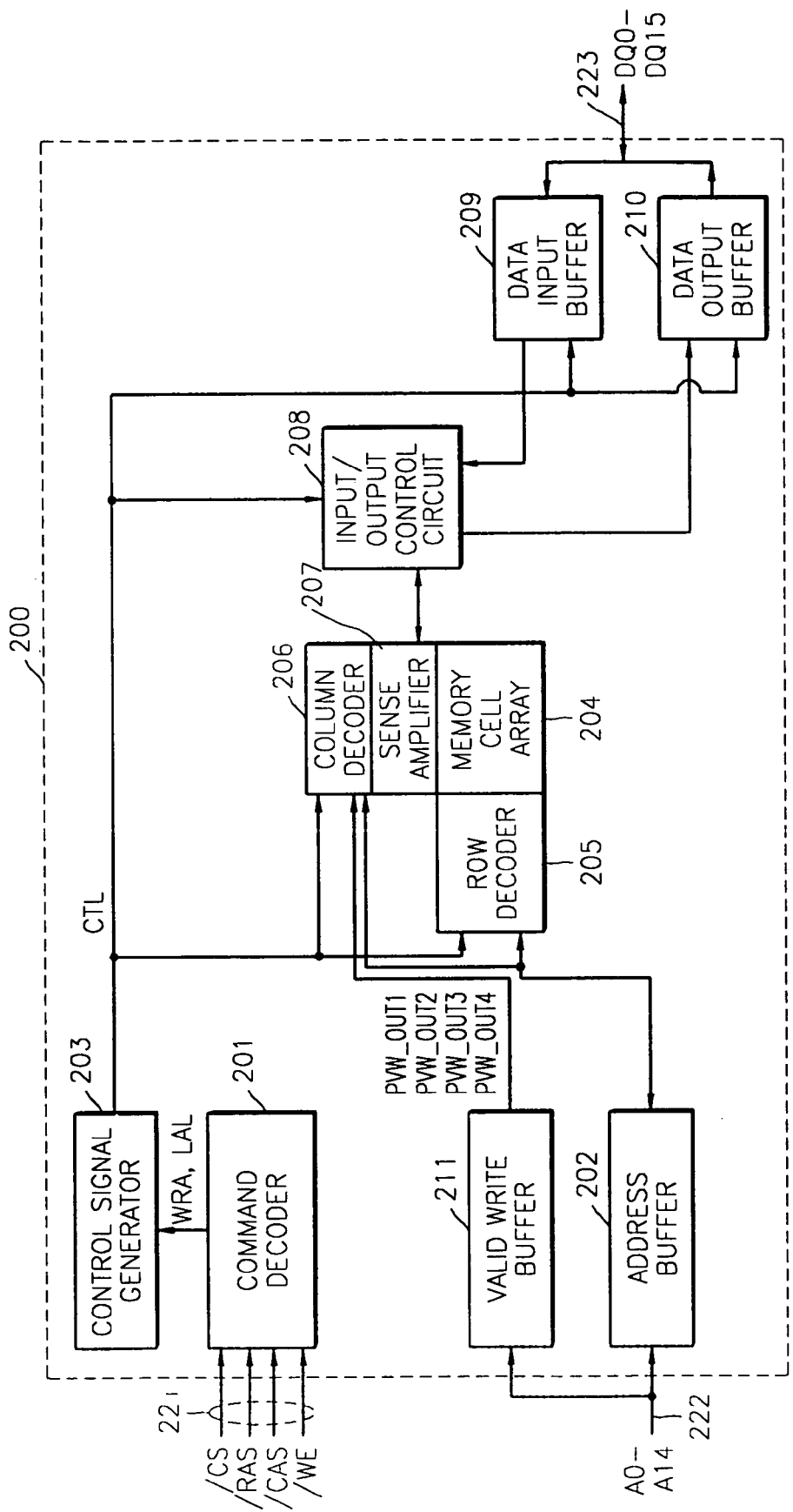
FIG. 3 is a block diagram of a 4-bit prefetch-type FCRAM having an improved data write control circuit according to a preferred embodiment of the present invention.

FIG. 3 is a block diagram of a 4-bit prefetch-type FCRAM having an improved data write control circuit according to a preferred embodiment of the present invention. Specifically, in FIG. 3, an X16 FCRAM is shown.

Referring to FIG. 3, an FCRAM 200 includes a command decoder 201, an address buffer 202, a control signal generator 203, a memory cell array 204, a row decoder 205, a column decoder 206, a sense amplifier 207, and an input/output control circuit 208.

In addition, the FCRAM 200 further includes a data input buffer 209, a data output buffer 210, and a valid write window buffer 211.

The command decoder 201 outputs a plurality of control commands including first and second write commands WRA and LAL in response to control signals /CS, /RAS, /CAS, and /WE input, for example from an external source, via control pins 221.

The address buffer 202 transmits a row address and a column address, which are input, for example from an external source, via address pins 222, to the row decoder 205 and the column decoder 206, respectively.

Here, an upper address for activating a wordline is input into the address buffer 202 when the first write command WRA is input, and a lower address for enabling a column select line is input into the address buffer 202 when the second write command LAL is input.

The control signal generator 203 activates a control signal CTL in response to the first and second write commands WRA and LAL. Core circuits of a DRAM, for example, the row decoder 205, the column decoder 206, the input/output control circuit 208, the data input buffer 209, and the data output buffer 210 are controlled by the control signal CTL.

The row decoder 205 decodes the row address and activates a wordline in the memory cell array 204 corresponding to the row address. The column decoder 206 decodes the column address and enables a column select line in the memory cell array 204 corresponding to the column address.

The sense amplifier 207 senses, amplifies, and outputs data read from a selected memory cell.

The input/output control circuit 208 transmits the data amplified by the sense amplifier 207 to the data output buffer 210 and transmits data input into the data input buffer 209 to the memory cell array 204.

Data to be written are input into the data input buffer 209 via data input/output pins 223, and the data output buffer 210 outputs the read data via the data input/output pins 223.

The valid write window buffer 211 outputs predetermined data masking control signals PVW_OUT1, PVW_OUT2, PVW_OUT3, and PVW_OUT4 to the column decoder 206 in response to a predetermined combined address signal input from an external source via the address pins 222 when the second write command LAL is output. Here, the predetermined combined address signal may be a combination of, for example, addresses A11 through A14.

The column decoder 206, which is controlled by the data masking control signals PVW_OUT1, PVW_OUT2, PVW_OUT3, and PVW_OUT4, disables a predetermined column select line. so that data can be prevented from being written in the predetermined column select line.

Figure 4:
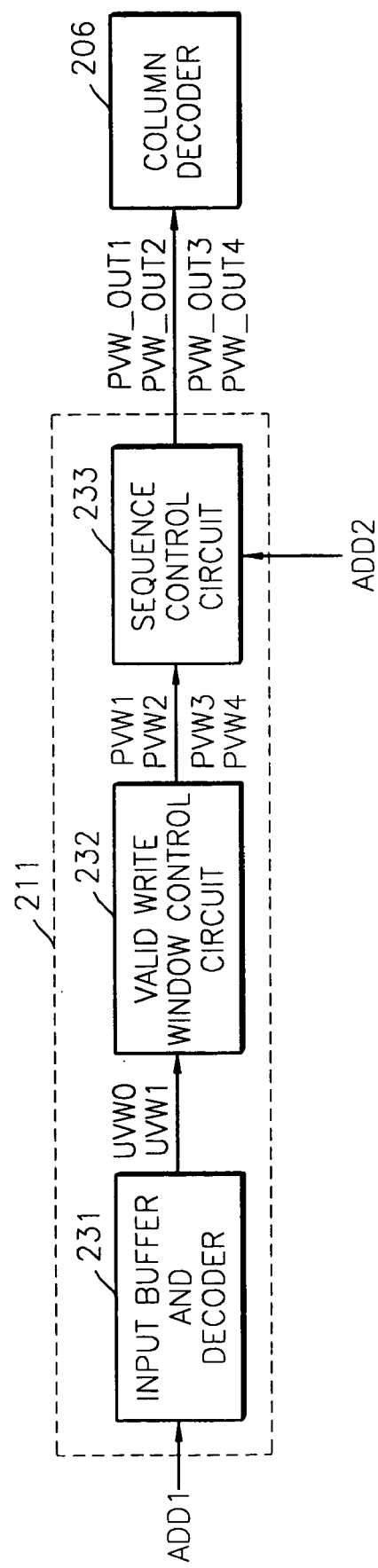
FIG. 4 is a block diagram of a valid write window buffer of the FCRAM shown in FIG. 3, in accordance with the present invention.

FIG. 4 is a block diagram of the valid write window buffer 211 of the FCRAM 200 of FIG. 3. Referring to FIG. 4, the valid write window buffer 211 includes an input buffer and decoder 231, a valid write window control circuit 232, and a sequence control circuit 233.

A predetermined address signal ADD1 among address signals input from an external source via the address pins 222 is input into the input buffer and decoder 231 when the second write command LAL is output.

When the address signal ADD1 is input, the input buffer and decoder 231 decodes the address signal ADD1 and outputs write control signals VW0 and VW1. The valid write window control circuit 232 outputs write information signals PVW1, PVW2, PVW3, and PVW4 in response to the write control signals VW0 and VW1.

Here, the predetermined address signal ADD1 may be a combination of the addresses A11 through A14. In addition, the write control signals VW0 and VW1 include write control signals UVW0 and UVW1 for controlling the writing of the upper data DQ8 through DQ15 and write control signals LVW0 and LVW1 for controlling the writing of the lower data DQ0 through DQ7.

A combination signal of the addresses A11. and A12 may be used to generate the write control signals UVW0 and UVW1, and a combination signal of the addresses A13 and A14 may be used to generate the write control signals LVW0 and LVW1.

In FIG. 4, the input buffer and decoder 231 generates the write control signals UVW0 and UVW1.

The sequence control circuit 233 determines a sequence of writing data in response to a predetermined address signal ADD2 and outputs the data masking control signals PVW_OUT1, PVW_OUT2, PVW_OUT3, and PVW_OUT4 based on the write information signals PVW1, PVW2, PVW3, and PVW4 and the determined data writing sequence.

The column decoder 206 disables a column select line in which data are prevented from being written in response to the data masking control signals PVW_OUT1, PVW_OUT2, PVW_OUT3, and PVW_OUT4.

Here, the predetermined address signal ADD1 is an address signal input from the external source via the address pins 222 when the second write command LAL is output by the command decoder 203 of FIG. 3. The predetermined address signal ADD1 is a signal for determining a sequence of writing input data. Preferably, the predetermined address signal ADD1 is a combination of addresses A0 and A1.

The write information signals PVW1, PVW2, PVW3, and PVW4 are signals indicating information related to the writing and masking of consecutively input data.

Accordingly, the write information signals PVW1, PVW2, PVW3, and PVW4 determine how many bits of the consecutively input data will be written, which will be described in greater detail in the following paragraphs.

For example, when data D0, D1, D2, and D3 are input and the write information signals PVW1, PVW2, PVW3, and PVW4 form a value of "1100", only the data D0 and D1 are written, and the other data D3 and D4 are masked.

Figure 5:
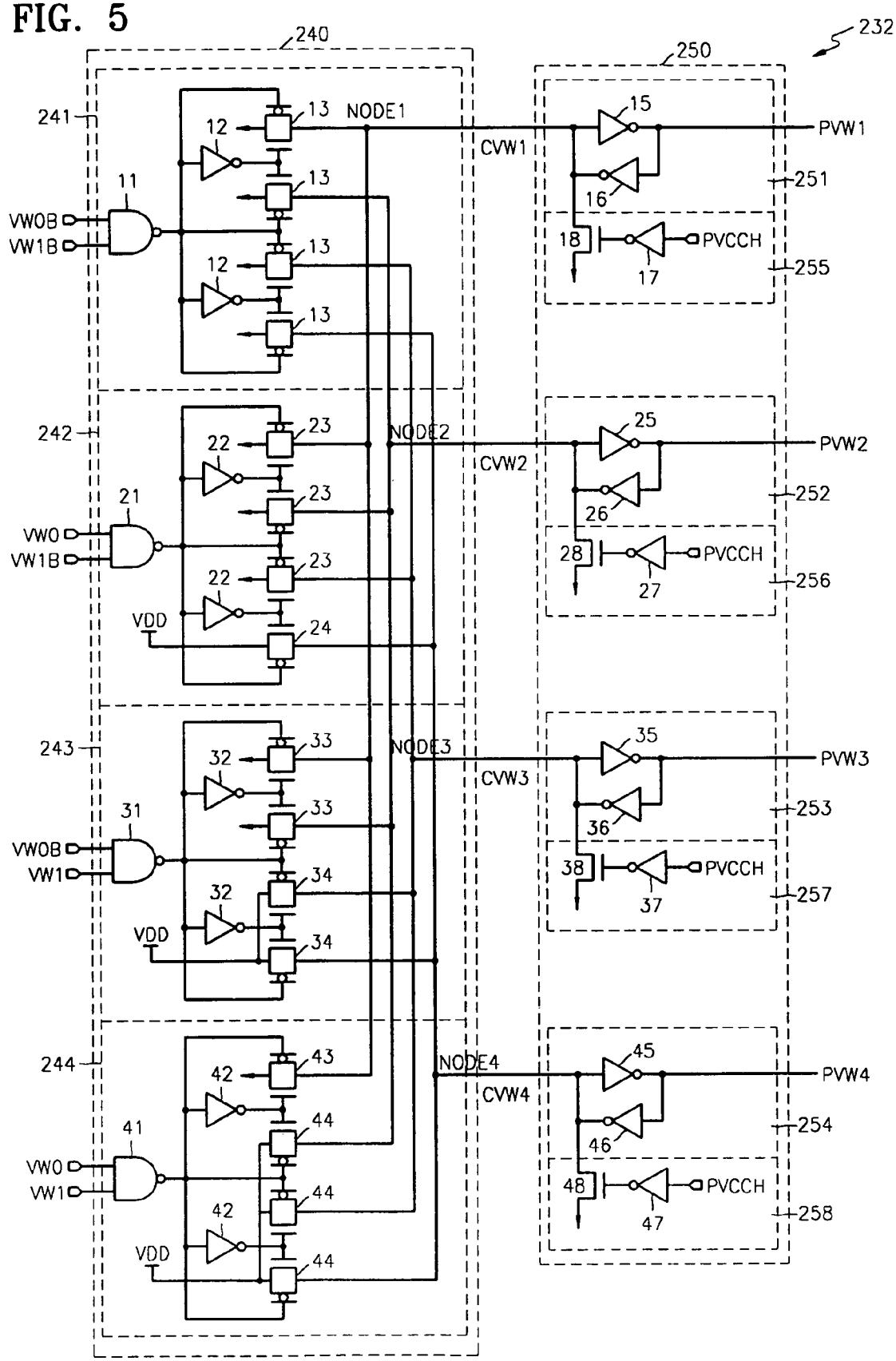
FIG. 5 is a circuit diagram of an example of a valid write window control circuit shown in FIG. 4, in accordance with the present invention.

FIG. 5 is a circuit diagram of an example of the valid write window control circuit 232 shown in FIG. 4. Referring to FIG. 5, the valid write window control circuit 232 includes a write information generation circuit 240 and an output circuit 250.

The write information generation circuit 240 outputs internal write information signals CVW1, CVW2, CVW3, and CVW4 in response to write control signals VW0, VW0B, VW1, and VW1B to nodes NODE1, NODE2, NODE3, and NODE4.

The output circuit 250 inverts the internal write information signals CVW1, CVW2, CVW3, and CVW4 and outputs the inverted signals as the write information signals PVW1, PVW2, PVW3, and PVW4.

The write information generation circuit 240 includes first through fourth write information generators 241 through 244.

Each of the first through fourth write information generators 241 through 244 includes NAND gates 11, 21, 31, and 41, inverters 12, 22, 32, and 42, and a plurality of transmission gates 13, 23, 24, 33, 34, 43, and 44.

The write control signals VW0B and VW1B are input into the NAND gate 11, and the write control signals VW0 and VW1B are input into the NAND gate 21. In addition, the write control signals VW0B and VW1 are input into the NAND gate 31, and the write control signals VW0 and VW1 are input into the NAND gate 41.

Here, the write control signals VW0 and VW1 are signals obtained by decoding a predetermined combined address signal using the input buffer and decoder 231 of FIG. 4. Also VW0B and VW1B represent the inverted write control signals.

Output ports of the transmission gates 13 are connected to the nodes NODE1, NODE2, NODE3, and NODE4 and input ports of the transmission gates 13 are connected to ground.

Output ports of the transmission gates 23 are connected to the nodes NODE 1, NODE2, and NODE3, and input ports of the transmission gates 23 are connected to ground. An output port of the transmission gate 24 is connected to the node NODE4, and an input port of the transmission gate 24 is connected to an internal voltage VDD.

Output ports of the transmission gates 33 are connected to the nodes NODE1 and NODE2 and input ports of the transmission gates 33 are connected to the ground. Output ports of the transmission gates 34 are connected to the nodes NODE3 and NODE4, and input ports of the transmission gates 34 are connected to the internal voltage VDD.

An output port of the transmission gate 43 is connected to the node NODE1, and an input port of the transmission gate 43 is connected to ground. Output ports of the transmission gates 44 are connected to the nodes NODE2, NODE3, and NODE4, and input ports of the transmission gates 44 are connected to the internal voltage VDD.

Output signals of the NAND gates 11, 21, 31, and 41 and output signals of the inverters 12, 22, 32, and 42 are input into the gates of the transmission gates 13, 23, 24, 33, 34, 43, and 44.

The output circuit 250 includes first through fourth latch circuits 251, 252, 253, and 254. The first through fourth latch circuits 251, 252, 253, and 254 are connected to the nodes NODE1, NODE2, NODE3, and NODE4, respectively. The first through fourth latch circuits 251, 252, 253, and 254 include inverters 15 and 16, inverters 25 and 26, inverters 35 and 36, and inverters 45 and 46, respectively.

The first through fourth latch circuits 251, 252, 253, and 254 include initial value setting circuits 255, 256, 257, and 258, respectively, for maintaining the initial voltage level of the nodes NODE1, NODE2, NODE3, and NODE4, respectively, at a predetermined level in response to a predetermined internal control signal PVCCH when power is supplied.

Here, the internal control signal PVCCH is generated by an additional control circuit (not shown).

Preferably, the initial value setting circuits 255, 256, 257, and 258 are each realized as inverters 17, 27, 37, and 47, respectively, and NMOS transistors 18, 28, 38, and 48, respectively. The inverters 17, 27, 37, and 47 invert the internal control signal PVCCH and output the inverted internal control signal to the gates of the NMOS transistors 18, 28, 38, and 48, respectively.

The operation of the valid write window control circuit 232 is as follows.

When the write control signals VW0 and VW1 are at a 'low' level, the write control signals VW0B and VW1B become 'high'.

Since the write control signals VW0B and VW1B are 'high', only the NAND gate 11 outputs a 'low' signal, and the other NAND gates 21, 31, and 41 output 'high' signals.

Since the output of the NAND gate 11 is 'low', only the transmission gates 13 are turned on, and the other transmission gates 23, 24, 33, 34, 43, and 44 are turned off.

Accordingly, when the write control signals VW0 and VW1 are 'low', the internal write information signals CVW1, CVW2, CVW3, and CVW4 are output by the write information generation circuit 240.

Since the transmission gates 13 are turned on, the internal write information signals CVW1, CVW2, CVW3, and CVW4 having a 'low' level are output to the nodes NODE1, NODE2, NODE3, and NODE4, respectively.

The first through fourth latch circuits 251, 252, 253, and 254 invert the internal write information signals CVW1, CVW2, CVW3, and CVW4 and output the write information signals PVW1, PVW2, PVW3, and PVW4 having a 'high' level.

Here, since the number of transmission gates 13, 23, 33, and 43 having input ports connected to the internal voltage VDD is different to the number of transmission gates 24, 34, and 44 having input ports connected to ground, the write information signals PVW1, PVW2, PVW3, and PVW4 output by the first through fourth write information generators 241, 242, 243, and 244, respectively, are different.

Accordingly, depending on which write information generator among the first through fourth write information generators 241, 242, 243, and 244 is turned on, values of the write information signals PVW1, PVW2, PVW3, and PVW4 vary, which is shown in Table 1 below.

TABLE 1

| VW0 | VW1 | PVW1 | PVW2 | PVW3 | PVW4 |
| --- | --- | --- | --- | --- | --- |
| 0 | 0 | 1 | 1 | 1 | 1 |
| 0 | 1 | 1 | 1 | 1 | 0 |
| 1 | 0 | 1 | 1 | 0 | 0 |
| 1 | 1 | 1 | 0 | 0 | 0 |

As shown in Table 1, when the write control signals form a value of '00', the first write information generator 241 is turned on. When the write control signals form a value of '01', the second write information generator 242 is turned on. When the write control signals form a value of '10', the third write information generator 243 is turned on. When the write control signals form a value of '11', the fourth write information generator 244 is turned on.

The write information signals PVW1, PVW2, PVW3, and PVW4 are input into the sequence control circuit 233 of FIG. 4. The sequence control circuit 233 determines a sequence in which consecutively input data are written, in response to the predetermined address signal ADD1.

The sequence control circuit 233 outputs control signals PVW—OUT1, PVW_OUT2, PVW_OUT3, and PVW_OUT4 to the column decoder 206 in response to the write information signals PVW1, PVW2, PVW3, and PVW4 and the determined data writing sequence.

Here, the column decoder 206 allows some bits among data input thereinto to be written and other bits to be masked in consideration of the values of the write information signals PVW1, PVW2, PVW3, and PVW4.

For example, assume that data D0, D1, D2, and D3 are input. When the write information signals PVW1, PVW2, PVW3, and PVW4 form a value of '1111', all the data D0 through D3 are written. In the case of the write information signals PVW1 through PVW4 forming a value of '1110', only the data D0 through D2 are written. In the case of the write information signals PVW1 through PVW4 forming a value of '1100', only the data D0 and D1 are written. In the case of the write information signals PVW1 through PVW4 forming a value of '1000', only the data D0 are written.

Accordingly, when the write information signals PVW1 through PVW4 form values of '1110', '1100', and '1000', D3, D2 and D3, and D1, D2, and D3 are masked.

Figure 6:
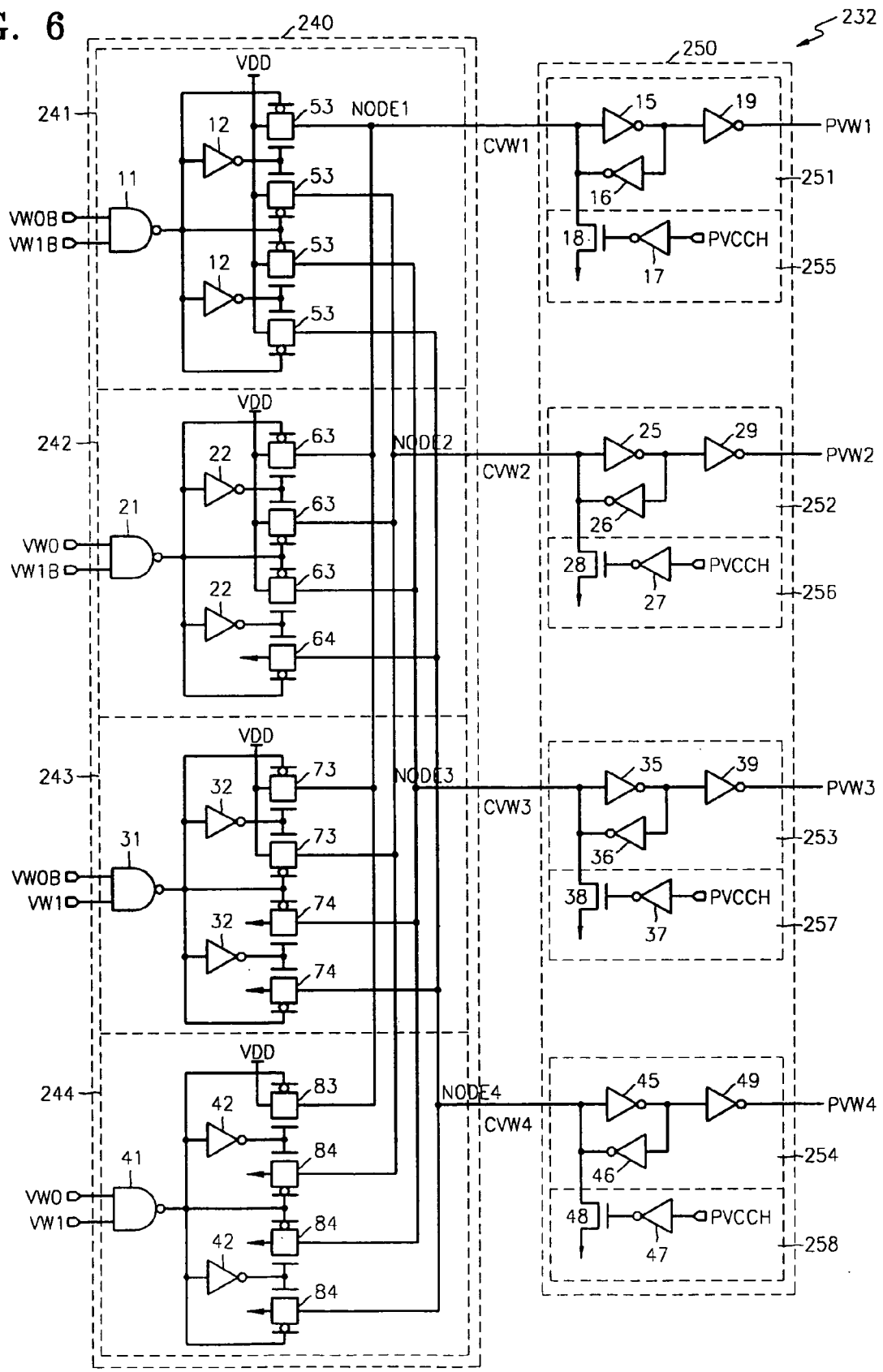
FIG. 6 is a circuit diagram of another example of the valid write window control circuit shown in FIG. 4, in accordance with the present invention.

FIG. 6 is a circuit diagram of another example of the valid write window control circuit 232 of FIG. 4. The structure and operation of the valid write window control circuit 232 shown in FIG. 6 are almost the same as those of the valid write window control circuit 232 shown in FIG. 5. However, there are two differences between the valid write window control circuit of FIG. 5 and the valid write window control circuit of FIG. 6, which will be described in the following paragraphs.

One difference is that unlike the transmission gates 13, 23, 24, 33, 34, 43, and 44 in the valid write window control circuit 232 of FIG. 5, input ports of transmission gates 53, 63, 73, and 83 in the valid write window control circuit 232 of FIG. 6 are connected to the internal voltage VDD and input ports of the transmission gates 64, 74, and 84 are connected to the ground. The other difference is that, in the valid write window control circuit 232 of FIG. 6, first through fourth latches 251, 252, 253, and 254 include inverters 19, 29, 39, and 49, respectively, which invert output signals of inverters 15, 25, 35, and 45, respectively, and output write information signals PVW1, PVW2, PVW3, and PVW4, respectively.

Figure 7:
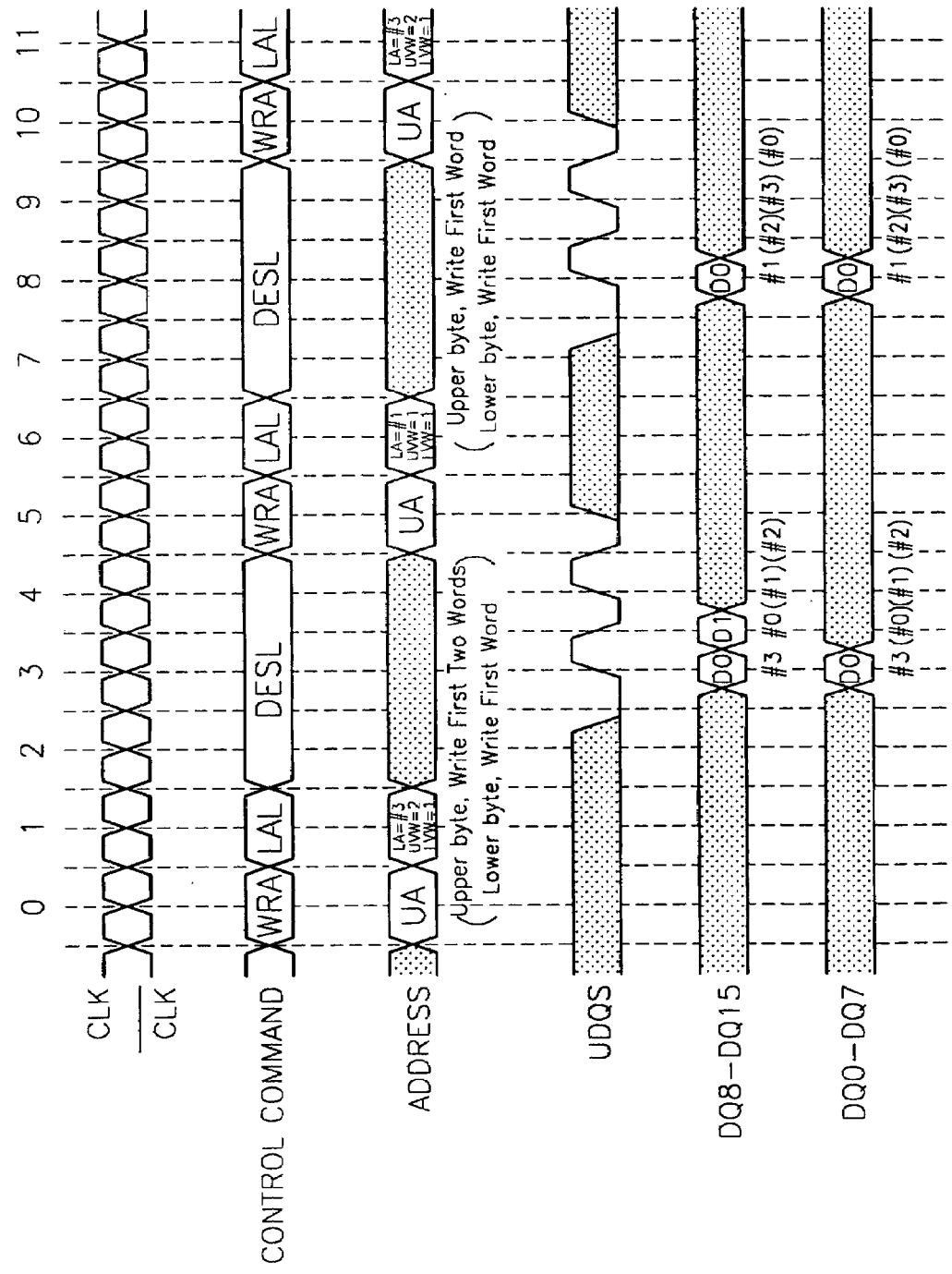
FIG. 7 is a timing diagram of input and output signals of the FCRAM shown in FIG. 3, in accordance with the present invention.

FIG. 7 is a timing diagram of input and output signals of the FCRAM of FIG. 3. As shown in FIG. 7, first and second write commands WRA and LAL are used in a FCRAM, unlike in a DDR SDRAM, which is shown in Table 2 below.

TABLE 2

| Control Commands | /CS | FN | BA1–BA0 | A14 | A13 | A12 | A11 | A10–A9 | A8 | A7 | A6–A0 |
| --- | --- | --- | --- | --- | --- | --- | --- | --- | --- | --- | --- |
| WRA (1st) | L | L | BA | UA | UA | UA | UA | UA | UA | UA | UA |
| LAL (2nd) | H | H or L | H or L | LVW0 | LVW1 | UVW0 | UVW1 | H or L | H or L | H or L | LA |

In Table 2, BA, UA, and LA represent a bank address, an upper address, i.e., an address used for activating a wordline, and a lower address, i.e., an address used for enabling a column select line. In addition, LVW0 and LVW1 are signals for controlling writing input data DQ0 through DQ7, and UVW0 and UVW1 are signals for controlling writing input data DQ8 through DQ15.

In FIG. 7, DESL (device deselect) represents a section where a control command is not input.

Different ways of controlling the writing of data depending on the state of the write control signals VW0 and VW1 are shown in the following table.

TABLE 3

| Burst length | Functions | VW0 | VW1 |
|---|---|---|---|
| 2 | Write all words | L | H or L |
|  | Write first word | H | H or L |
| 4 | Reserved | L | L |
|  | Write all words | H | L |
|  | Write first two words | L | H |
|  | Write first word | H | H |

As shown in Table 3 above, in the FCRAM according to an embodiment of the present invention, only a predetermined number of successive bits among the data input into the data input buffer 209 are written, and the rest of the input data are prevented from being written, which will be described in greater detail in the following paragraphs.

As shown in FIG. 7, a predetermined combined address signal used for controlling the writing of data is input into the valid write window buffer 211 of FIG. 3 when the second write command LAL is output. The predetermined combined address signal is constituted by any combinations of addresses A11 through A14, as shown in Table 2.

The valid write window buffer 211 decodes the combined address signal and generates the write control signals LVW0, LVW1, UVW0, and UVW1, determines a sequence in which to write input data, and controls the column decoder 206 based on whether or not data are prevented from being written. The column decoder 206 is controlled by the valid write window buffer 211 so that the corresponding data can or cannot be written.

In FIG. 7, when the second write command LAL is output, the write control signal UVW, generated in response to the combined address signal input into the valid write window buffer 211, includes write information used to control only the first two words of input data to be written, and the write control signal LVW includes write information used to control only the first word of the input data to be written.

Accordingly, in the case of the data DQ8 through DQ15, only the first two words D0 and D1 are written, and the rest of each of the data DQ8 through DQ15 are banned from being written.

In the case of the data DQ0 through DQ7, only the first word D0 is written, and the rest of each of the data DQ0 through DQ7 are banned from being written.

As shown in FIG. 7, the FCRAM having an improved data write control circuit according to the present invention is capable of controlling writing data using a predetermined combined address signal without the need for a data input/output masking pin.

Figure 8:
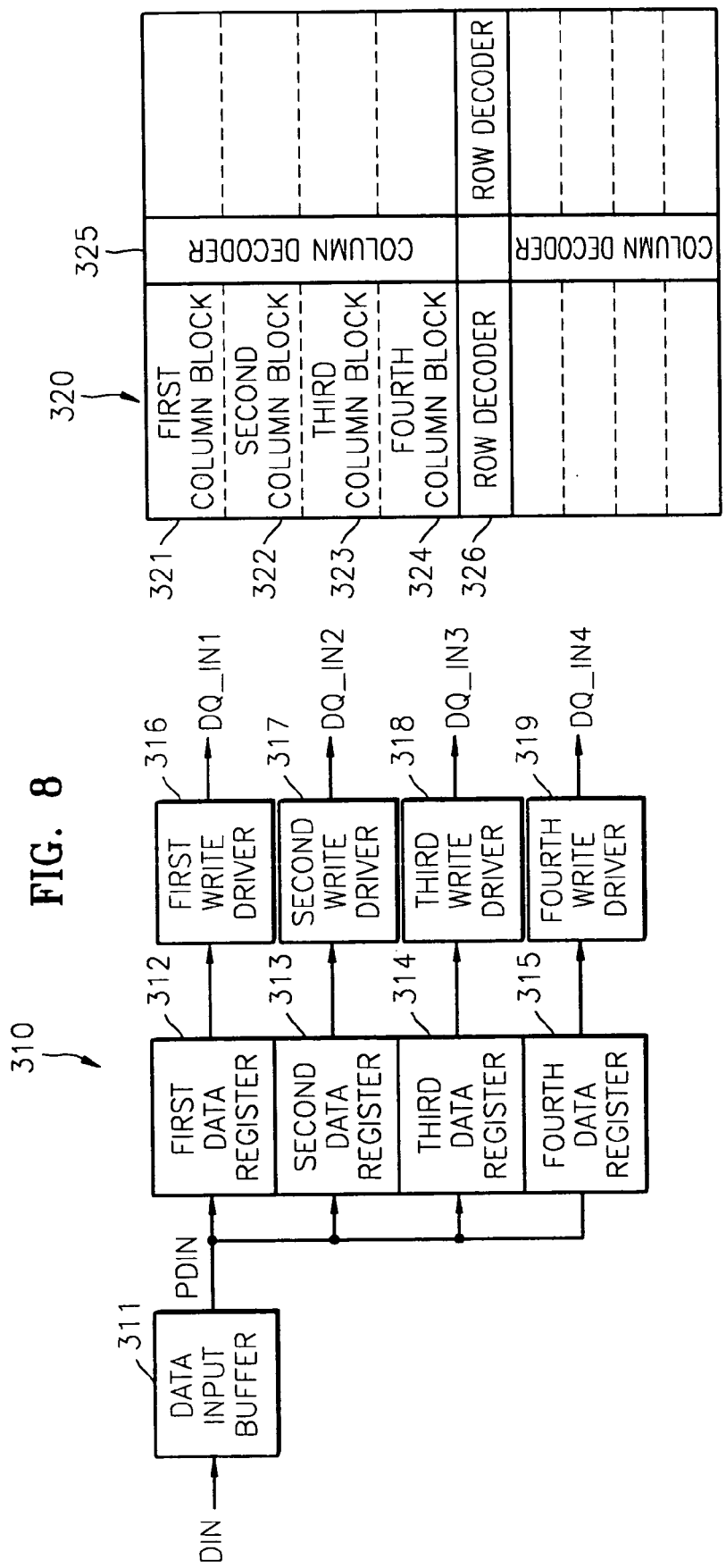
FIG. 8 is a block diagram of a data input circuit and a memory cell array of a 4-bit prefetch-type FCRAM according to a preferred embodiment of the present invention.

FIG. 8 is a block diagram of a data input circuit and a memory cell array of a 4-bit prefetch-type FCRAM according to an embodiment of the present invention. Referring to FIG. 8, a data input circuit 310 of a 4-bit prefetch-type FCRAM includes a data input buffer 311, first through fourth data registers 312, 313, 314, and 315, and first through fourth write drivers 316, 317, 318, and 319.

The data input buffer 311 receives data DIN from a data input/output pin, synchronizes the data DIN with an internal clock signal CLK, and then outputs data PDIN. The data PDIN are classified into first through fourth data DQ_IN1, DQ_IN2, DQ_IN3, and DQ_IN4, and the first through fourth data registers 312, 313, 314, and 315 store the first through fourth data DQ_IN1, DQ_IN2, DQ_IN3, and DQ_IN4, respectively. The first through fourth write drivers 316, 317, 318, and 319 are connected to the first through fourth data registers 312, 313, 314, and 315, respectively, and output the first through fourth data DQ_IN1, DQ_IN2, DQ_IN3, and DQ_IN4, respectively, to first through fourth data lines (not shown), respectively.

In the 4-bit prefetch-type FCRAM shown in FIG. 8, there are 4 separate data paths, and a bank 320 of a memory cell array is divided into first through fourth column blocks 321, 322, 323, and 324. The first through fourth data DQ_IN1, DQ_IN2, DQ_IN3, and DQ_IN4 are recorded in the first through fourth column blocks 321, 322, 323, and 324, respectively.

Figure 9:
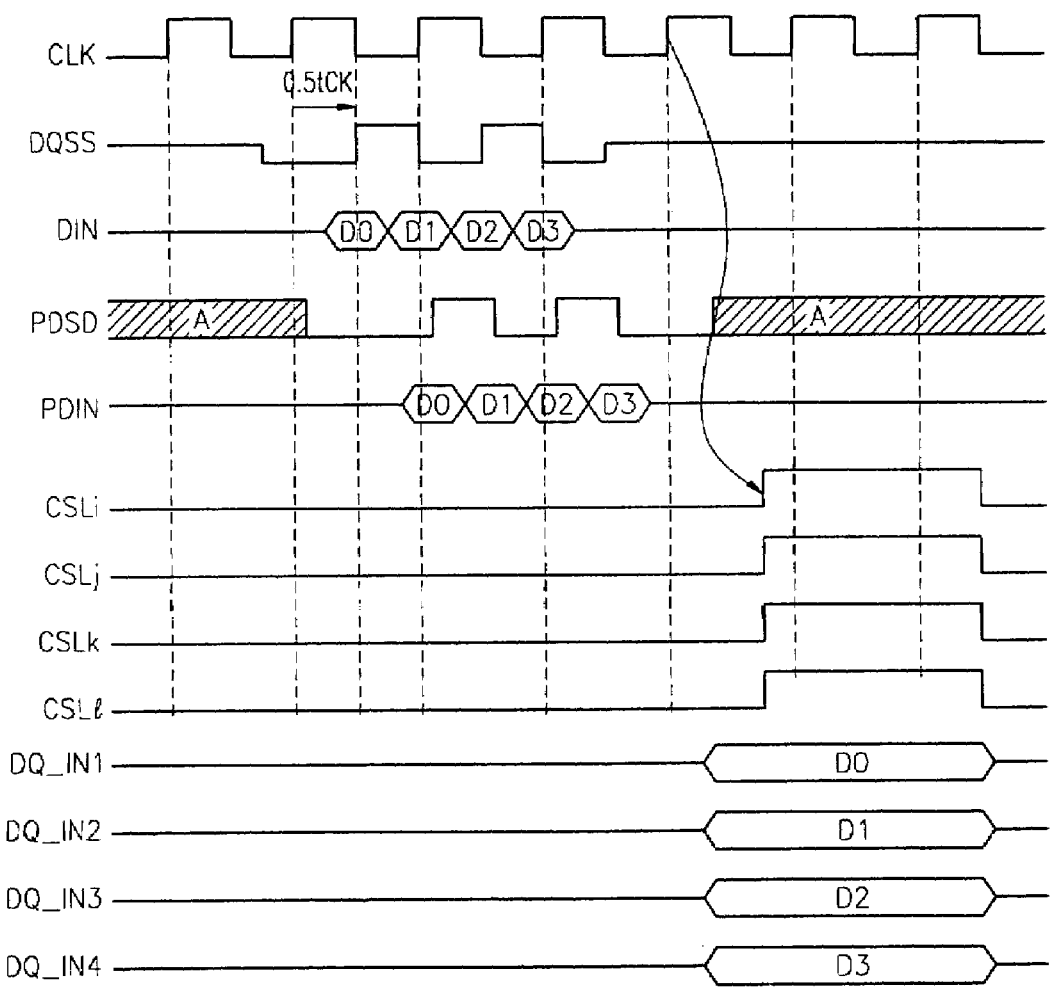
FIG. 9 is a timing diagram of input and output signals of the data input circuit shown in FIG. 8, in accordance with the present invention.

FIG. 9 is a timing diagram of input and output signals of the data input circuit 310 of FIG. 8. In FIG. 9, DQSS is a signal indicating a margin between a data strobe signal DQS and a clock signal CLK, and PDSD is a signal obtained by buffering the data strobe signal DQS using an additional buffer (not shown).

In addition, PDIN is a signal buffered by the data input buffer 311, and PCLK is a signal buffered by an additional clock buffer (not shown). A section indicated by "A" in the flow of the buffered signal PDSD of the data strobe signal DQS indicates an invalid data section. In FIG. 9, CSLi, CSLj, CSLk, and CSLl represent an i-th column select line enabling signal, a j-th column select line enabling signal, a k-th column select line enabling signal, and an l-th column select line enabling signal.

As shown in FIG. 9, the column select line enabling signals CSLi, CSLj, CSLk, and CSLl are enabled in synchronization with the same clock signal. The input data DIN are separated into the first through fourth data DQ_IN1, DQ_IN2, DQ_IN3, and DQ_IN4. The first through fourth data DQ_IN1, DQ_IN2, DQ_IN3, and DQ_IN4 are input via separate input paths and recorded in the first through fourth column blocks 321, 322, 323, and 324, respectively, when the column select line enabling signals CSLi, CSLj, CSLk, and CSLl are enabled.

As described above, since in the 4-bit prefetch-type FCRAM according to the present invention, there are four different data paths for the first through fourth data DQ_IN1, DQ_IN2, DQ_IN3, and DQ_IN4, it is easy to control recording of the first through fourth data DQ_IN1, DQ_IN2, DQ_IN3, and DQ_IN4.

In addition, since in the 4-bit prefetch-type FCRAM according to the present invention, the valid write window control circuit 232 is constituted by the transmission gates 13, 23, 24, 33, 34, 43, and 44, the internal circuit structure of the valid write window buffer 211 can be simplified.

The advantages and effects of the present invention will become more apparent with the following comparative embodiment.

Comparative Embodiment

Figure 10:
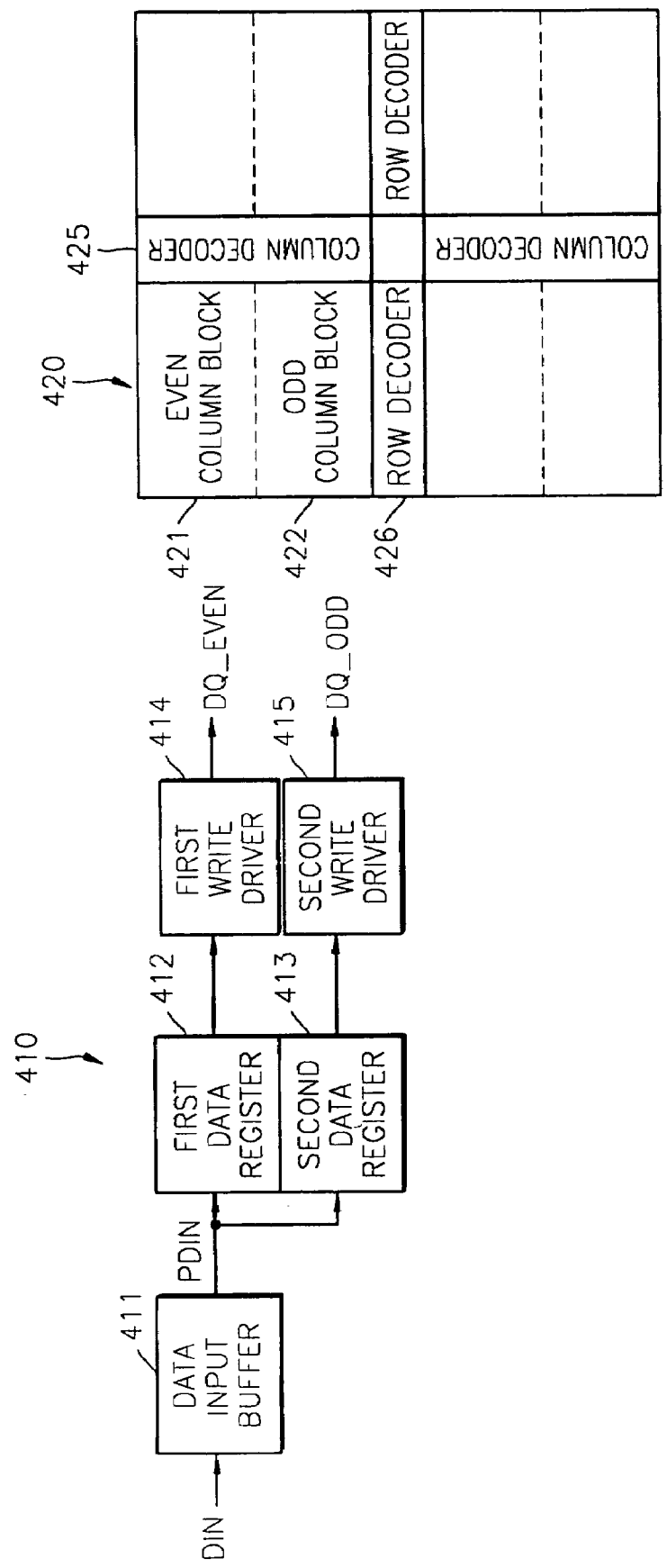
FIG. 10 is a block diagram of a data input circuit and a memory cell array of a 2-bit prefetch-type FCRAM.

FIG. 10 is a block diagram of a data input circuit and a memory cell array of a 2-bit prefetch-type FCRAM. Referring to FIG. 10, a data input circuit 410 of a 2-bit prefetch-type FCRAM includes a data input buffer 411, first and second data registers 412 and 413, and first and second write drivers 414 and 415.

The data input buffer 411 receives data DIN from a data input/output pin, synchronizes the data DIN with an internal clock signal CLK, and outputs data PDIN. The data PDIN are classified into even data DQ_EVEN and odd data DQ_ODD, and the first and second data registers 412 and 413 store the even data DQ_EVEN and the odd data DQ_ODD, respectively. The first and second write drivers 414 and 415 are connected to the first and second data registers 412 and 413, respectively, and output the even data DQ_EVEN and the odd data DQ_ODD, respectively, to an even data line (not shown) and an odd data line (not shown), respectively.

In the 2-bit prefetch-type FCRAM shown in FIG. 10, there are two separate data paths, and a bank 420 of a memory cell array is divided into an even column block 421 and an odd column block 422. Accordingly, the even data DQ_EVEN and the odd data DQ_ODD are written in the even column block 421 and the odd column block 422, respectively.

Figure 11:
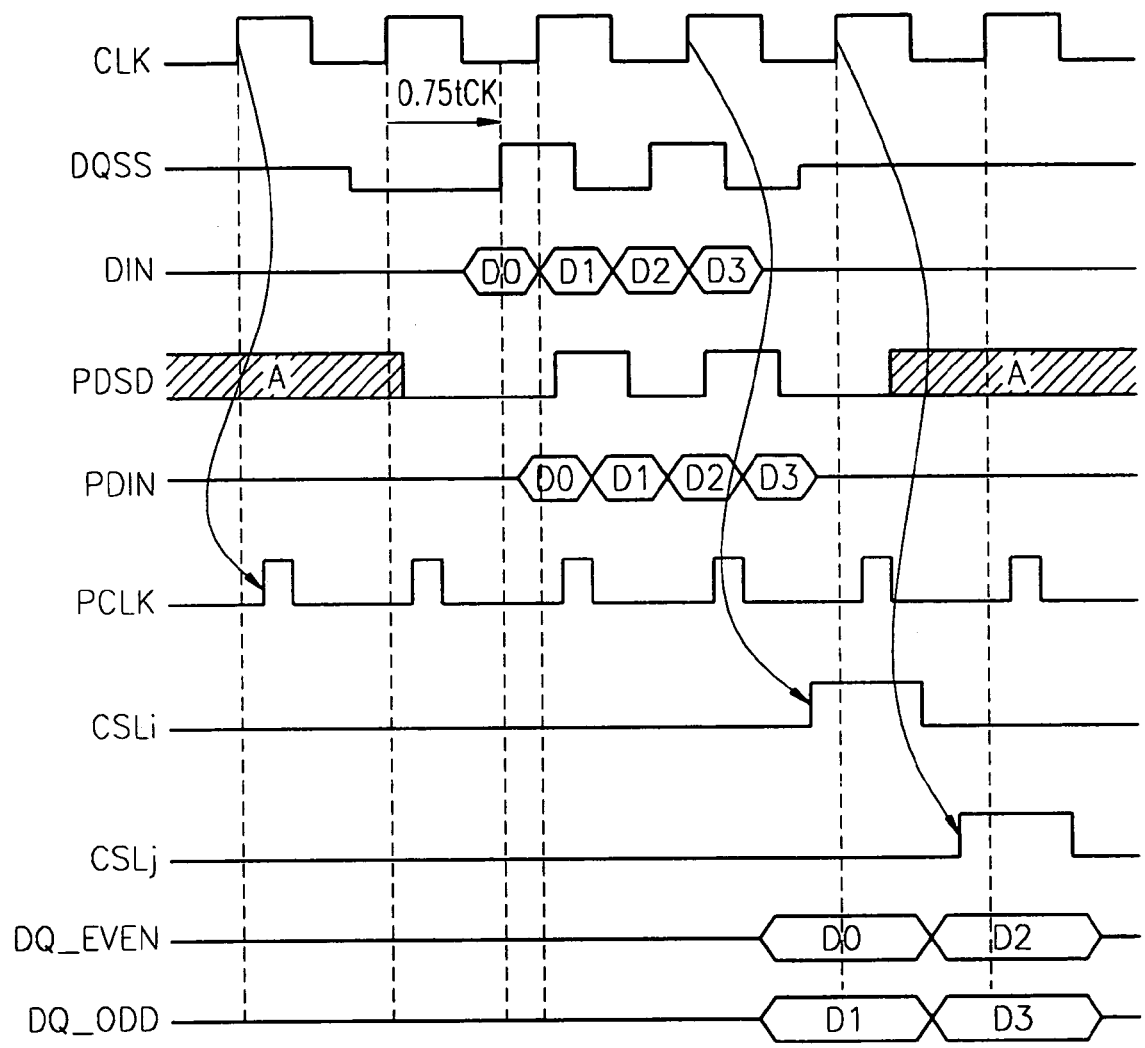
FIG. 11 is a timing diagram of input and output signals of the data input circuit shown in FIG. 10.

FIG. 11 is a timing diagram of input and output signals of the data input circuit shown in FIG. 10. In FIG. 11, DQSS, PDSD, PDIN, DIN, PCLK, CSLi, CSLj, and A are the same as the corresponding ones that have been described above with reference to FIG. 9, and thus their description will not be repeated here.

As shown in FIG. 11, the column select line enabling signals CSLi and CSLj are enabled in synchronization with different clock periods. The input data DIN are separated into the even data DQ_EVEN and the odd data DQ_ODD. The even data DQ_EVEN and the odd data DQ_ODD are input along different data input paths and then are recorded in the even column block 421 and the odd column block 422, respectively, when the column select line enabling signals CSLi and CSLj are enabled, which will be described in greater detail in the following paragraph.

In FIG. 11, when D0 through D3 are input as the input data DIN and D0 and D1 are classified as the even data DQ_EVEN and the odd data DQ_ODD, respectively, D2 is classified as the even data DQ_EVEN, following D0, and D3 is classified as the odd data DQ_ODD, following D1.

Figure 12:
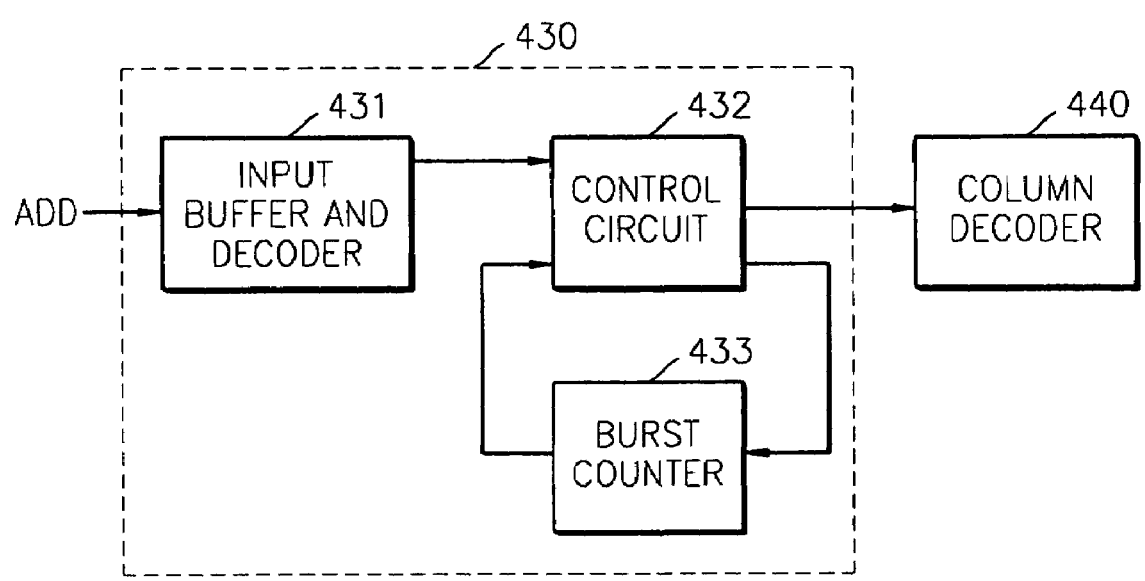
FIG. 12 is a block diagram of a comparative example of a valid write window buffer.

FIG. 12 is a diagram of a comparative example of a valid write window buffer according to a preferred embodiment of the present invention. Referring to FIG. 12, a valid write window buffer 430 includes an input buffer and decoder 431, a control circuit 432, and a burst counter 433.

When it receives a predetermined combined address signal ADD, the input buffer and decoder 431 decodes the predetermined combined address signal ADD and then outputs a predetermined write control signal. The control circuit 432 outputs a column decoder control signal in response to the predetermined write control signal so that predetermined data can or cannot be written.

The burst counter 433 increments its value after the recording of each cycle of even data and odd data is completed and outputs a predetermined count value to the control circuit 432. Specifically, when the control circuit 432 outputs a column decoder control signal used for writing first even data D0 and first odd data D1, as shown in FIG. 11, the burst counter 433 increments its value and notifies the control circuit that writing of the first even and odd data D0 and D1 has been completed by outputting the incremented value to the control circuit 432.

The control circuit 432 outputs a column decoder control signal used for writing second even and odd data D2 and D3 in response to the output of the burst counter 433.

As described above, the writing of even and odd data is sequentially controlled by the output of the burst counter 433. Accordingly, the valid write window buffer 430 requires a temporary memory device (not shown) for storing a write control signal for a next cycle.

The valid write window buffer 430 requires such a burst counter and a temporary memory device, and its control circuit is constituted by a complicated logic circuit. Accordingly, the area of an FCRAM increases, and the internal circuit structure of the FCRAM gets more complicated.

Unlike the valid write window buffer 430 shown in FIG. 12, the valid write window buffer 211 of the present invention, for example that shown and described with respect to FIG. 4 above, does not require a burst counter and a temporary memory device, and the valid write window control circuit 232 is comprised of transmission gates. However, the valid write window buffer 211 controls the writing of data input thereinto in a relatively simple structure.

As described above, according to the 4-bit prefetch-type FCRAM of the present invention and the method of masking data using the 4-bit prefetch-type FCRAM, it is possible to mask unwanted data by controlling a column decoder with the use of a predetermined combined address signal without the need of a complicated circuit structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A prefetch-type FCRAM having an improved data write control circuit in a semiconductor memory device including a memory cell array, a plurality of address pins, and a plurality of data pins, the prefetch-type FCRAM comprising:
   a command decoder which outputs control commands including first and second write commands in response to predetermined external input signals;
   a row decoder which decodes a row address signal input by the address pins and activates a wordline of the memory cell array corresponding to the decoded row address signal;
   a column decoder which decodes a column address signal input by the address pins and activates a column select line of the memory cell array corresponding to the decoded column address signal;
   a data input buffer which receives input data from the plurality of data pins and outputs the input data in synchronization with a predetermined clock signal;
   a data output buffer which outputs output data read from the memory cell array to the plurality of data pins; and
   a valid write window buffer which outputs a data masking control signal that controls the masking of input data in response to a combined address signal input by the address pins,
   wherein the column decoder disables a column select line where data to be masked among the input data will be input in response to the data masking control signal.

2. The prefetch-type FCRAM of claim 1, wherein the combined address signal is some of a plurality of bits applied to the address pins when the second write command is applied.

3. The prefetch-type FCRAM of claim 1, wherein the combined address signal comprises:
   a first address signal used for controlling the prevention of the input data from being written; and
   a second address signal used for controlling a sequence of writing the input data.

4. The prefetch-type FCRAM of claim 3, wherein the valid write window buffer comprises:
   an input buffer and decoder which decodes the first address signal and outputs a predetermined write control signal;
   a valid write window control circuit which outputs a write information signal indicating whether to mask each bit of the input data, every four bits of which are input in series through the plurality of data pins, in response to the write control signal; and a sequence control circuit which determines a sequence of writing the input data in response to the second address signal and outputs the data masking control signal in response to the sequence and the write information signal.

5. The prefetch-type FCRAM of claim 4, wherein the valid write window control circuit comprises:

a write information generation circuit which outputs an internal write information signal in response to the write control signal; and an output circuit which latches the internal write information signal and outputs the write information signal.

6. The prefetch-type FCRAM of claim 5, wherein the write information generation circuit comprises first through fourth write information generators which generate an internal write information signal in response to the write control signal, and the output circuit comprises first through fourth latches connected to the first through fourth write information generators, respectively, which latch the internal write information signal and output the write information signal.

7. The prefetch-type FCRAM of claim 6, wherein the first through fourth latches each include an initial value setting circuit for maintaining initial voltage levels of input ports of the first through fourth latches, respectively, at a predetermined level in response to a predetermined internal control signal when power is applied.

8. The prefetch-type FCRAM of claim 6, wherein each of the first through fourth write information generators comprises:

a NAND gate, which performs a logic operation on the write control signal;

a plurality of inverters which invert an output signal of the NAND gate and outputs the inverted signal; and a plurality of transmission gates which are turned on in response to the output signals of the NAND gate and the plurality of inverters and then output the internal write information signal.

9. The prefetch-type FCRAM of claim 8, wherein the plurality of transmission gates of at least one of the first through fourth write information generators have input ports connected to ground.

10. The prefetch-type FCRAM of claim 8, wherein the plurality of transmission gates of some of the first through fourth write information generators have some input ports connected to ground and other input ports connected to a predetermined internal voltage.

11. The prefetch-type FCRAM of claim 8, wherein the plurality of transmission gates of at least one of the first through fourth write information generators have input ports connected to a predetermined internal voltage.

12. The prefetch-type FCRAM of claim 11, wherein the first through fourth latches each include an inverter for inverting and outputting its corresponding latch's output signal.

13. The prefetch-type FCRAM of claim 1, wherein the FCRAM is a 4-bit FCRAM.

14. A method of masking input data in a semiconductor memory device including a memory cell array, a plurality of address pins, and a plurality of data pins, the method comprising:

(a) generating control commands including first and second write commands in response to predetermined external input signals;

(b) receiving a row address signal, a column address signal, and an combined address signal through the plurality of address pins;

(c) receiving the input data through the plurality of data pins;

(d) decoding the row address signal and activating a wordline of the memory cell array corresponding to the decoded row address signal;

(e) decoding the column address signal and enabling a column select line of the memory cell array corresponding to the decoded column address signal;

(f) generating a data masking control signal that controls the masking of input data in response to the combined address signal; and (g) disabling, using a column decoder, a column select line where data to be masked among the input data will be input in response to the data masking control signal.

15. The method of claim 14, wherein the combined address signal is some of a plurality of bits applied to the address pins when the second write command is applied.

* * * * *